United States Patent
Banks

[11] Patent Number: 6,095,823
[45] Date of Patent: Aug. 1, 2000

[54] METHOD OF ELECTRICALLY CONNECTING A COMPONENT TO A PCB

[75] Inventor: Anthony Paul Banks, Berkshire, United Kingdom

[73] Assignee: NEC Corporation, Tokyo, Japan

[21] Appl. No.: 09/160,565

[22] Filed: Sep. 25, 1998

[30] Foreign Application Priority Data

Sep. 27, 1997 [GB] United Kingdom .................... 9720531

[51] Int. Cl.⁷ .................................................. H01R 12/00
[52] U.S. Cl. .............................................. 439/66; 439/876
[58] Field of Search ................................ 439/66, 83, 876, 439/91

[56] References Cited

U.S. PATENT DOCUMENTS

| | | | |
|---|---|---|---|
| 3,509,270 | 4/1970 | Dube et al. | 174/266 |
| 3,616,532 | 11/1971 | Beck | 439/83 |
| 4,029,375 | 6/1977 | Gabrielian | 439/66 |
| 5,186,634 | 2/1993 | Thompson | 439/82 |
| 5,388,998 | 2/1995 | Grange et al. | 439/66 |

FOREIGN PATENT DOCUMENTS 7-161416   6/1995   Japan .............................. H01R 23/66

*Primary Examiner*—Renee Luebke
*Assistant Examiner*—T. C. Patel
*Attorney, Agent, or Firm*—Scully, Scott Murphy & Presser

[57] ABSTRACT

A system for detachable mounting a component onto a printed circuit board comprises a printed circuit board having a through-hole, a compression spring constructed from, or coated with, an electrically conductive material, and a component having an electrical contact thereon. The compression spring having a first end of a diameter larger than the diameter of the through-hole, and a second end smaller than the diameter of the through-hole. The second end of the compression spring passes through the through-hole and is secured at its first end to the first side of the printed circuit board. The second end of the compression spring protrudes beyond the second side of the printed circuit board. When the component is placed against the second side of the printed circuit board, the compression spring is compressed and the desired electrical connection is formed.

8 Claims, 2 Drawing Sheets

METHOD OF ELECTRICALLY CONNECTING A COMPONENT TO A PCB

BACKGROUND OF THE INVENTION

1. Field of the Invention

The present invention relates to a system and method for detachably mounting a component onto a printed circuit board (PCB) and is particularly concerned with applications where space is limited.

2. Description of the Related Art

There are many conventional methods of electrically connecting components to PCBs. For example, in a mobile telephone, a SIM (subscriber identity module) is electrically connected to the PCB. The SIM is a card type memory in which various information about the subscriber is memorized. To connect the SIM to the PCB, the conventional mobile telephone has a holder which holds the SIM, and the SIM is inserted in the holder and is electrically connected to the PCB. It is desirable to make the thickness of the mobile telephone thin so as to become convenient to carry the mobile telephone.

However, conventional mobile telephone requires the thickness for the holder. Therefore, the holder hinders from making the thickness of the mobile telephone thin.

SUMMARY OF THE INVENTION

It is an object of the present invention to provide a simple cost-effective and space-efficient system and method for detachably mounting a component onto a printed circuit board (PCB).

According to a first aspect of the present invention, there is provided a system for detachable mounting a component onto a printed circuit board (PCB) so as to provide a reliable electrical connection therebetween, comprising:

(1) a PCB having a through-hole between a first side having a printed region thereon and a second side, (2) a compression spring constructed from, or coated with, an electrically conductive material, said compression spring having a first end of a diameter larger than the diameter of the through-hole, and a second end smaller than the diameter of the through-hole, and (3) a component having an electrical contact thereon, to be detachably mounted onto the PCB, wherein the second end of the compression spring passes through said through-hole and is fixedly secured at its first end to the printed region on the first side of the PCB, the second end of the compression spring protruding beyond the second side of the PCB, such that, in use, when the component is correctly placed against the second side of the PCB, the compression spring is compressed and the desired electrical connection is formed via the compression spring and the electrical contact of the component.

According to a second aspect of the present invention, there is provided a method for detachably mounting a component onto a printed circuit board (PCB) so as to provide a reliable electrical connection therebetween, comprising the steps of:

(1) providing a through-hole between a first side having a printed region thereon and a second side of a PCB, (2) passing a compression spring constructed from or coated with an electrically conductive metal through the through-hole, (3) fixedly securing a first end of the compression spring to the printed region on the first side of the PCB, and (4) placing a component having an electrical contact thereon against the second side of the PCB, such that the compression spring is compressed and an electrical connection is made between the compression spring and the electrical contact of the component.

Advantageously, the compression spring is compressed into the through-hole and so a "zero-height" connection is formed i.e. no additional space is taken up in forming the connection between the component and the PCB.

Preferably, the component is a subscriber identity module (SIM) of a mobile telephone.

The compression spring is preferably gold plated and is preferably secured to the printed region of the PCB by solder.

If more than one connection is required, an appropriate number of through-hole, compression springs and electrical contacts may be provided.

The above objects, features and advantages of the present invention will become apparent from the following description with reference to the accompanying drawings which illustrate example of the present invention.

BRIEF DESCRIPTION OF THE DRAWINGS

An embodiment of the present invention will now be described, by way of example, with reference to the accompanying drawings in which.

DESCRIPTION OF THE PREFERRED EMBODIMENT

Figure 1:
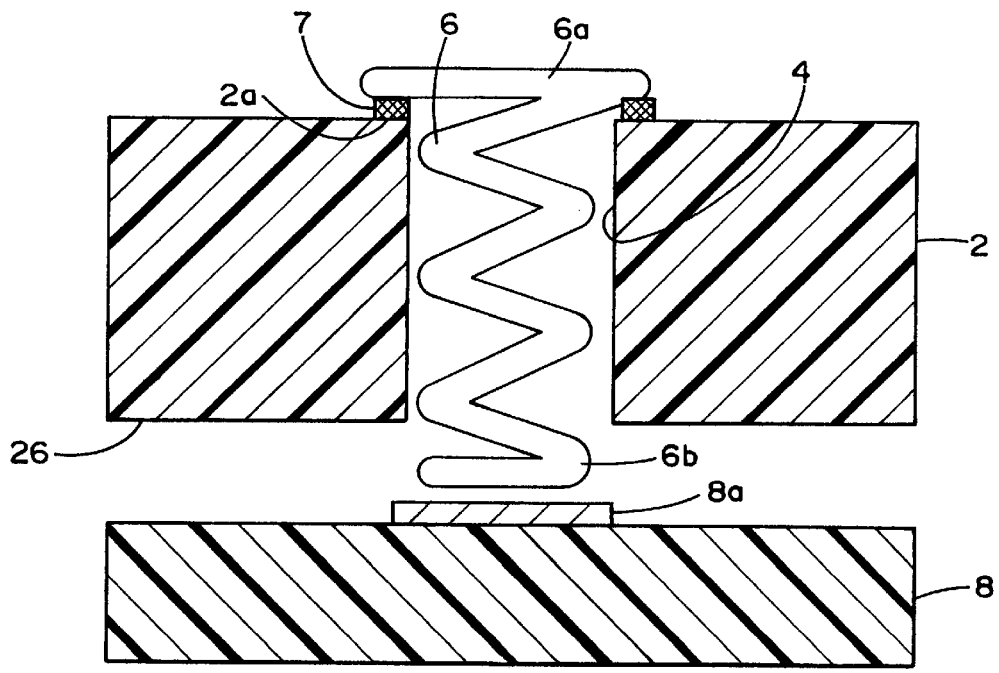
FIG. 1 shows schematically an arrangement in accordance with the present invention in which no electrical contact is made.

Referring to FIG. 1, a printed circuit board (PCB) 2 has a through-hole 4 through which a gold-plated compression spring 6 passes. A first end region 6a of the compression spring 6 has an enlarged diameter relative to the rest of the compression spring 6, and this region 6a is secured to a printed region 2a of the PCB 2 by solder 7, so as to form an electrical contact therebetween. A second end region 6b of the compression spring protrudes beyond a non-printed side 26 of the PCB. As shown in FIG. 1, the compression spring 6 is in its uncompressed state. A subscriber identity module (SIM) 8 having a gold contact 8a thereon is in proximity to the non-printed side 2b of the PCB 2 but is not touching the compression spring 6. Hence, no electrical contact is made. Note that for clarity, the gold pad 8a is shown upstanding from the surface of the SIM. Usually, the pad 8a will be substantially flush with the surface of the SIM 8 or even slightly recessed therein.

Figure 2:
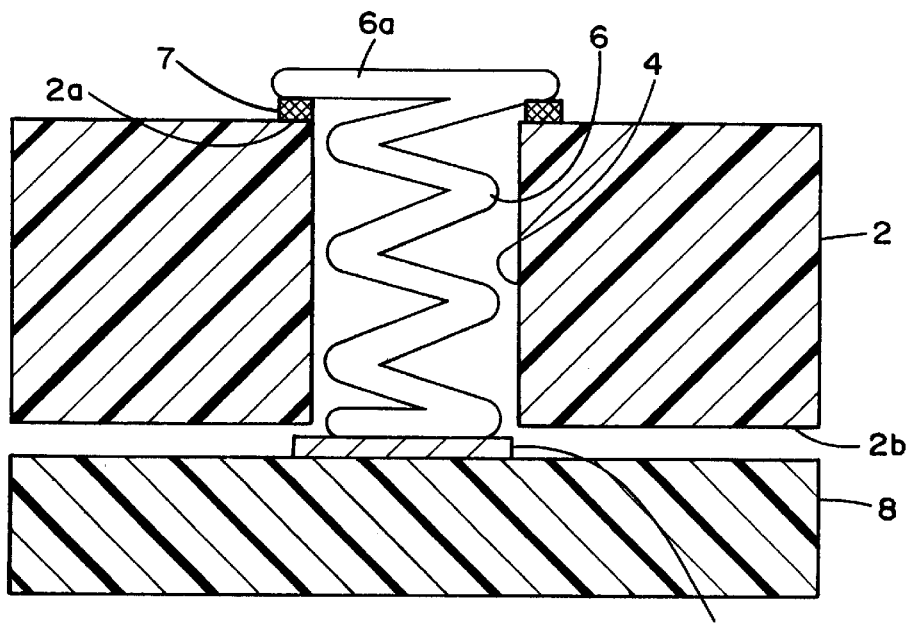
FIG. 2 shows the same arrangement in which an electrical contact is made.

Referring to FIG. 2, the SIM 8 has been placed substantially flush against the non-printed side 2b of the PCB 2. Clips (not shown) are provided to removably secure the SIM in this position. Electrical contact is made between the gold pad 8a of the SIM 8 and the second end region 6b of the spring, and thus the SIM is electrically connected to the PCB. The compression spring 6 is compressed into the through hole 4, and good contact is maintained between the PCB 2 and the SIM 8 by virtue of the biasing of the compression spring 6 towards the SIM 8.

In use, the above connecting arrangement occupies substantially no more space than the PCB and SIM itself, the only additional space required being the thickness of the compression spring 6 at its first end 6a and the depth of solder. No additional space is required between the SIM 8 and the PCB 2.

In alternative embodiments (not shown), the second side 2b of the PCB 2 is also printed. In which case it is necessary to ensure that either there is no printing in a region that will come into contact with the pad 8a of the SIM 8, or that any such printing is adequately insulated.

Figure 3:
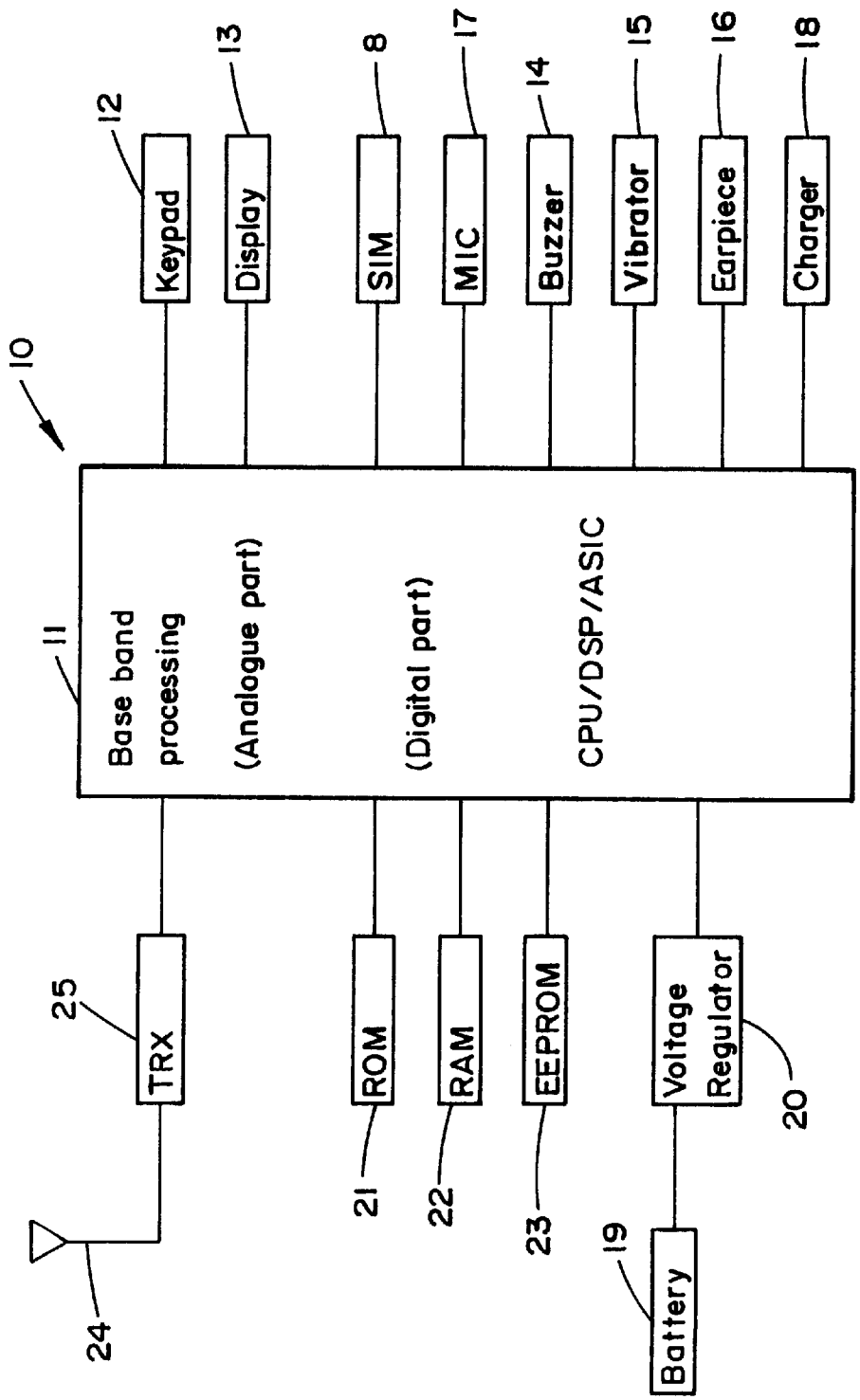
FIG. 3 is a block diagram of a mobile telephone.

Referring to FIG. 3, a mobile telephone 10 mainly consists of an antenna 24, a transceiver 25, a baseband processing part 11, a keypad 12, a display 13, a buzzer 14, a vibrator 15, an ear piece 16, a MIC 17, a charger 18, a battery 19, a voltage regulator 20, memories (ROM 21, RAM 22, EEPROM 23) and the SIM 8.

The transceiver 25 is to act as a transducer between a baseband signal and an RF signal. The baseband processing part 11 has CPU, DSP and ASIC as the digital part and a modulator and A/D and D/A converters as the analogue part. The baseband processing part 11 conducts call processing, channel codec, speech processing, and peripheral device management. The keypad 12 is a device for inputting commands or instructions by user. The display 13 shows status and response to the user. The charger 18 charges the battery 19. The MIC 8 and the ear piece 16 are kind of transducers between an acoustic signal and an electric signal. The voltage regulator 20 stabilizes voltage supplied from the battery 19 and supplies some stabilized voltage to devices in the phone.

The SIM 8 is a kind of a storage device which has CPU, ROM, RAM and non volatile memory (for ex. EEPROM) inside with security system. It stores many kinds of information for personal use. The SIM 8 is mounted to the mobile telephone 10 by using the above connecting arrangement shown in FIG. 2.

While a preferred embodiment of the present invention has been described using specific terms, such description is for illustrative purposes only, and it is to be understood that changes and variations may be made without departing from the spirit or scope of the following claims.

What is claimed is:

1. A system for detachably mounting a component onto a printed circuit board (PCB) so as to provide a reliable electrical connection therebetween comprising:

(1) a PCB having a through-hole between a first side having a printed region thereon and a second side, (2) a compression spring constructed from, or coated with, an electrically conductive material, said compression spring having a first end of a diameter larger than the diameter of the through-hole, and a second end smaller than the diameter of the through-hole, and (3) a component having an electrical contact thereon, to be detachably mounted onto the PCB, wherein the second end of the compression spring passes through said through-hole and is fixedly secured at its first end to the printed region on the first side of the PCB, the second end of the compression spring protruding beyond the second side of the PCB, such that, in use, when the component is correctly placed against the second side of the PCB, the compression spring is compressed and the desired electrical connection is formed between the PCB and the electrical contact of the component via the compression spring.

2. A system in accordance with claim 1, wherein the component is subscriber identity module (SIM) of a mobile telephone.

3. A system in accordance with claim 1, wherein the compression spring is gold plated.

4. A system in accordance with claim 1, wherein the compression spring is secured to the printed region of the PCB by solder.

5. A system in accordance with claim 1, wherein a plurality of through-holes, compression springs and electrical contacts are provided.

6. A method for detachably mounting a component onto a printed circuit board (PCB) so as to provide a reliable electrical connection therebetween, comprising the steps of:

(1) providing a through-hole between a first side having a printed region thereon and a second side of a PCB, (2) passing a compression spring, having a first end and a second end, constructed from or coated with an electrically conductive metal through the through-hole, (3) fixedly securing the first end of the compression spring to the printed region on the first side of the PCB, and (4) placing a component having an electrical contact thereon against the second end of the compression spring and compressing the compression spring towards the first end of the compression spring to form a compressed electrical connection between the compression spring and the electrical contact of the component.

7. A method in accordance with claim 6 using the system of claim 1.

8. A mobile telephone incorporating the system in accordance with claim 1.

* * * * *